(12) United States Patent
Yusa et al.

(10) Patent No.: US 7,211,207 B2
(45) Date of Patent: *May 1, 2007

(54) INJECTION MOLDING METHOD WITH SURFACE MODIFICATION

(75) Inventors: Atsushi Yusa, Ibaraki (JP); Teruo Hori, Fukui (JP)

(73) Assignee: Hitachi Maxell, Ltd., Ibaraki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/100,524

(22) Filed: Apr. 7, 2005

(65) Prior Publication Data

US 2005/0175849 A1    Aug. 11, 2005

Related U.S. Application Data

(62) Division of application No. 10/442,976, filed on May 22, 2003, now Pat. No. 6,955,781.

(30) Foreign Application Priority Data

May 22, 2002  (JP) .............................. 2002-148263
Nov. 22, 2002  (JP) .............................. 2002-339020

(51) Int. Cl.
    *B29C 45/00*   (2006.01)
(52) U.S. Cl. ................................... 264/50; 264/328.17

(58) Field of Classification Search ........... 264/328.17, 264/50, 161, 328.7, 293, 572, 162
See application file for complete search history.

(56) References Cited

U.S. PATENT DOCUMENTS

| 4,303,603 | A | 12/1981 | Torobin |
| 5,000,903 | A | 3/1991 | Matzinger et al. |
| 5,215,697 | A | 6/1993 | Toki et al. |
| 6,337,039 | B1 | 1/2002 | Yamaki et al. |
| 6,610,221 | B2 | 8/2003 | Bawa et al. |
| 6,676,867 | B2 | 1/2004 | Tsuchiya et al. |
| 6,790,870 | B1 * | 9/2004 | DeSimone et al. ........... 521/79 |
| 6,955,781 | B2 * | 10/2005 | Yusa et al. .................. 264/162 |
| 2004/0145086 | A1 * | 7/2004 | Yusa ...................... 264/328.11 |

FOREIGN PATENT DOCUMENTS

| JP | 62-222816 A | 9/1987 |
| JP | 09-202975 A | 8/1997 |
| JP | 10-012994 A | 1/1998 |
| JP | 2001-237518 A | 8/2001 |
| JP | 2001-277281 A | 10/2001 |
| JP | 2001-316832 A | 11/2001 |
| WO | WO 01/47694 A1 | 7/2001 |

* cited by examiner

*Primary Examiner*—Jill L. Heitbrink
(74) *Attorney, Agent, or Firm*—Birch, Stewart, Kolasch & Birch, LLP

(57) ABSTRACT

A molded article includes thermoplastic resin, and an organic material different from the thermoplastic resin inside said molded article, the organic material being located on and near a surface of said molded article.

14 Claims, 16 Drawing Sheets

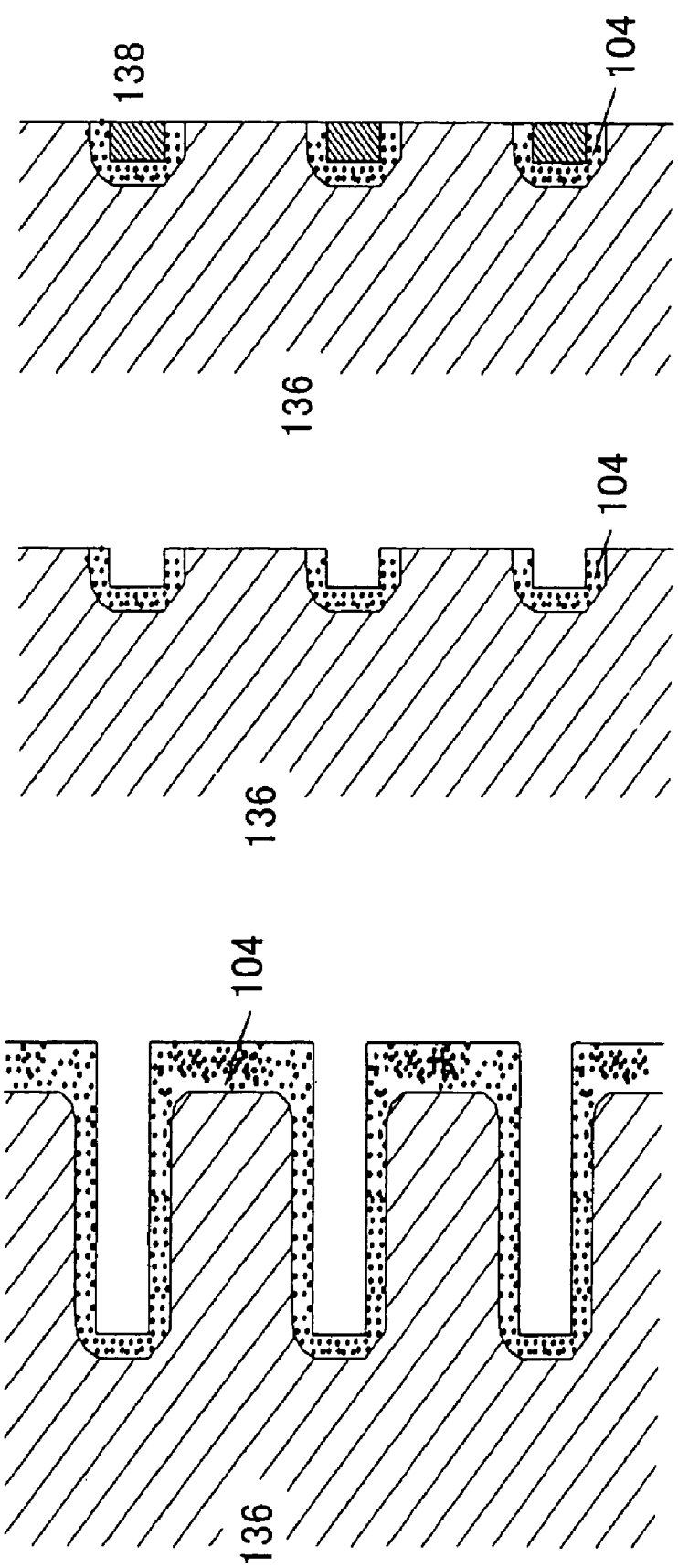

INJECTION MOLDING METHOD WITH SURFACE MODIFICATION

This application is a Divisional of co-pending application Ser. No. 10/442,976, filed on May 22, 2003 now U.S. Pat. No. 6,955,781, and for which priority is claimed under 35 U.S.C. § 120; and this application claims priority of Application Nos. 2002-148263 filed in Japan on May 22, 2002 and 2002-339020 filed in Japan on Nov. 22, 2002 under 35 U.S.C. § 119; the entire contents of all are hereby incorporated by reference.

BACKGROUND OF THE INVENTION

The present invention relates generally to injection-molded articles made of thermoplastic resin (or molten resin), methods for manufacturing the molded article using injection molding, and injection molds and injection molding machines, and more particularly to a surface modification of a molded article using injection molding.

A wide variety of plastic molded articles are made using injection molding, and the plasticized molten resin materials determine their physical properties. The plastic molded article may be subject to various types of printing, coating, formations of electric conductors and metal films, junctions with another molded article, and other posttreatments. These necessary posttreatments generally activate a surface of the plastic molded article for surface modification and processing improvement.

On the other hand, the electroless plating is widely used to form a metal conductor film on a surface of an electronic apparatus made of the plastic molded article. The electronic plating procedure to plastic is generally pursuant to a flowchart shown in FIG. 15 although it slightly differs according to materials and other conditions.

The "degreasing" step initially removes the oil etc. from the surface of the molded article, and the "etching" step roughs the surface. The etching uses chrome acid solution and alkali metal hydroxide solution. The etchant requires a posttreatment, such as neutralization, causing increased cost, and the toxic etchant is problematic in handling. The "wetting" step then improves wettability using a process with surfactant solution, and the "catalyst (catalyzing)" step attaches catalyst to the plastic surface. For palladium catalyst, the "catalyzing" process impregnates the plastic in hydrochloric acid solution consisting of stannous chloride and palladium chloride. After the "catalyzing" step, the "accelerator (catalyst activation)" step activates plating catalyst using acid, such as sulfuric acid and hydrochloric acid. The "electroless plating" is not available until these processes finish.

Some processes have conventionally been proposed which rough a surface without etching (see for example, Japanese Laid-Open Patent Applications Nos. 9-59778 and 2001-303255). These references propose to form a thin film including plating catalyst on a plastic surface using organic binder and UV cure resin. Similarly, as disclosed, for example, in Japanese Laid-Open Patent Application No. 6-87964, technology has already known which irradiates ultraviolet ("UV") laser onto and modifies a plastic surface in an atmosphere of gas, such as amine compounds. Other known surface modification technologies include corona discharge treatments, plasma treatments and UV treatments.

A semi-additive method has been known as one of methods that form wiring on a circuit board using electroless plating and electrolysis plating. FIG. 16 shows this flow. This method uses the "electroless plating" step to form a plated layer with a thickness of 1 to 2 µm on the entire substrate using the same steps as discussed above. Then, the "exposure and development" step follows with masking after a "photosensitive film and resist" are formed, so as to form film and resist layers that include a wiring pattern. The "electrolysis plating" step forms an electrolysis plated layer on the electroless plated layer that has exposed. After the film and resist are removed, soft etching forms plated wires by removing the electroless plated layer from part other than the wiring part. Due to bad adhesion properties with resin, the copper plating would sometimes require a posttreatment referred to as "black treatment", which creates fine projections made of copper (oxide) to enhance an anchor effect with the resin.

Methods have also been conventionally proposed which provide a molded article with a three-dimensional circuit (see, for example, Japanese Laid-Open Patent Applications Nos. 4-76985 and 1-206692). These methods initially form a plastic three-dimensional circuit board by molding resin. Then, an electroless plated layer is entirely formed and the photoresist is entirely applied after the surface is roughed and catalyzed. The surface is exposed through a photomask and developed to remove part other than circuit-pattern forming part. The electrolysis plating and electroless plating using Ni and Au follow, and photoresist is peeled off and unnecessary portion of the electroless plating is removed. It is difficult to form the photoresist as a uniform three-dimensional structure. Japanese Laid-Open Patent Application No. 4-76985 proposes to use electrodeposition resist, but this resist has disadvantageously low alkali resistance.

A circuit forming method using injection molding has also proposed (see, for example, Japanese laid-Open Patent Application No. 6-196840). Japanese Laid-Open Patent Application No. 6-196840 initially roughs a surface of a mold with Ra of 1 to 5 µm as a circuit forming surface, attaches catalyst cores onto the entire surface before injection molding, and forms the circuit board using injection molding, transferring the catalyst cores onto the entire surfaces. The electroless plating strongly adheres to a roughed molded surface that has strong adhesion property with the catalyst cores, and the other non-roughed part has such weak adhesion property that the non-roughed part may be removed with catalyst cores in etching that removes the electroless plated layer other than a circuit after the electrolysis plating.

No technologies have yet been proposed which may provide a surface modification simultaneous with an injection molding process and have a wide variety of applications. In addition, the conventional plastic electroless plating processes are complex and expensive as well as being problematic in handling waste disposal of many hazardous materials. The conventional processes that dispense with etching for roughing treat finished molded articles in a separate step, and thus are unsuitable for mass production. The conventional method that forms plated wiring on the plastic molded articles disadvantageously requires complex steps before and after the electroless plating, needs many toxic organic solvents, and roughs the plastic surface. The method disclosed in Japanese Laid-Open Patent Application No. 6-196840 may modify a plastic surface at the time of injection molding, but does not disclose a concrete way of uniformly attaching catalyst cores to the surface of the mold, as well as requiring not only circuit part on the surface to be roughed on the mold but also the etching step to be conducted after molding.

BRIEF SUMMARY OF THE INVENTION

Accordingly, in order to solve the above disadvantages, it is an exemplified object of the present invention to provide a molded article that has a surface modified entirely or locally in injection molding without roughing the surface so that the surface is applicable, for example, to the electroless plating, a method for manufacturing the same, a mold and injection molding apparatus used to manufacture the same.

A molded article of one aspect of the present invention includes thermoplastic resin, and an organic material different from the thermoplastic resin or a metallic element inside the molded article, the organic material or metallic element being located (segregating, or localizing) on and near a surface of the molded article. The term "near a surface of the molded article" means "in the molded article and close to the surface", and properly defined by an object of surface modification and materials to be used, preferably within 100 µm from a surface, and more preferably within 10 µm from a surface. Depending upon an object of surface modification and materials to be used, the term may mean a nanometer thickness scale from the surface. This molded article contains the organic material etc., on and near the surface, and thus has good stability because the organic material etc. are harder to be peeled out of the surface than those formed by the lithography. The organic material etc. may be formed on the surface entirely or at a selected position.

The modified article may further include a plated layer that has been formed using the metallic element as cores. The plated layer may form an electric wiring pattern.

The molded article may have cellular porous media in the thermoplastic resin.

For example, the organic material is organometallic complex. The metallic element may be metallic particles or metallic fine particles. The metallic element may be one generated from the organometallic complex from which part or all of the ligand is removed. The whole or local electrical conductivity or magnetism may be provided by entirely or locally arranging the organometallic complex or metallic element on and near the resin surface. For example, use of resin would seal, for example, a biochip easily. In other words, a glass plate and plastic may be easily sealed by adhering plastic having fine convexes and concaves as a channel for fluid, to the glass plate, etc., and generating a magnetic force from a rear surface of the glass plate. The entire or partial segregation of a metallic element onto a surface would be able to make a molded article that has a different mechanical property at that part. The segregated part of the metallic element improves in sliding performance and hardness when compared with the other part. A magnetic circuit pattern may be formed by using magnetic metal. Use of a fluorescent material, such as rare earth complex, as the metallic complex would be able to form a molded article that has a fluorescent pattern on its surface. Such a molded article is applicable, for example, to a display device.

The type of metallic complex is arbitrary, but is preferably Pd complex, Ni complex, Co complex, Pt complex, or the like, more specifically, dimethyl platinum (cyclooctadiene), bis (cyclopentadienyl) nickel, bis (acetylacetnate) paradium, etc. The molded article may further include an electroless plated layer formed from the metallic element as cores. Thereby, the plated layer may be formed at a selected position easily, and serve as an electric wiring pattern. In other words, the inventive molded article may be used for an electric wiring board. The plastic molded article may further include form cells to make the plastic molded article lightweight, enhance its adiabatic effect, and improve a ratio of rigidity to weight.

Of course, the organic material is not limited to the organic metallic complex. When the organic material uses polypropylene glycol, a hydrophobic plastic surface, such as polyethylene terephthalate, may be selectively made hydrophilic. Similarly, use of a fluorine compound would provide selective water repellency and reduce refractive index.

A method of another aspect of the present invention for manufacturing a molded article through injection molding of thermoplastic resin includes the step of injecting, into a mold, the thermoplastic resin, supercritical fluid and a material dissolved in the supercritical fluid to modify a surface of the molded article. This manufacture method may use the supercritical fluid to impregnate the material into the thermoplastic resin and enable the material segregate on and near the surface of the resin, manufacturing a molded article that more stably fixes the material than those which have a surface modified by the lithography, as discussed.

The usable supercritical fluid may arbitrarily include air, $CO_2$, butane, pentane, methanol, etc., but $CO_2$ is preferable because it has solubility similar to that of n-hexane, serves as a plasticizer to certain thermoplastic resin materials, and is famous for high performance in injection molding and extrusion molding. The material to be dissolved in the supercritical fluid is not limited and may include, for example, metallic complex, such as dimethyl platinum (cyclooctadiene), bis (cyclopentadienyl) nickel, and bis (acetylacetnate) paradium, and polypropylene glycol, etc. Use of the metallic complex would be able to selectively improve the adhesion property of plastic to electroless plating.

The thermoplastic resin is not limited, but may use polycarbonate, polymethyl methacrylate, polyether imide, polymethyl pentene, amorphous polyolefin, polytetrafluoroethylene, liquid crystal polymer, styrene resin, polymethyl pentene, polyacetal, etc. or a combination of some of them, or polymer alloy that has these elements as a principal constituent, and one that compounds them with various types of fillers.

The injecting step may include the step of introducing the supercritical fluid and the material in a flow front of the thermoplastic resin to the mold in injection filling. This method uses a fountain flow effect of the flowing resin in the mold to draw the thermoplastic resin at the flow front part along the mold surface and form a surface layer, and the material that dissolves into the supercritical fluid and impregnates in the flow front in the resin localizes in a layer near the surface that contacts the mold. The material soluble in the supercritical fluid to some extent would uniformly disperse and concentrate only on and near a surface of the mold. Therefore, various applications may be expected to plastic surface modification technologies. Use of $CO_2$ as the supercritical fluid would serve as a plasticizer, as discussed, to improve flowability of the thermoplastic resin and retard a growth of solidified layer on the surface that contacts the mold. The injecting step may include the supercritical fluid and the material into injection start part of the thermoplastic resin.

The injecting step may include the step of introducing, into the mold, the supercritical fluid and the material as counterpressure that applies pressure in a direction opposite to a flow direction of the thermoplastic resin in injection molding. The counterpressure may localize the dissolved material only on and near the surface of the molded article. When the counterpressure mixes $CO_2$ or $N_2$ gas as the supercritical fluid for a blowing agent in the thermoplastic resin, the inner pressure of the thermoplastic resin rapidly decreases in the mold at the time of ejaculation and prevents not only foam cell diameter from expanding but also a surface from forming a design referred to as a swale mark that deteriorates the flatness of the surface. At the same time, the supercritical fluid and dissolved material may be arranged only near and on the surface using the above fountain flow phenomenon.

The injecting step may include the steps of introducing the supercritical fluid without the material into part of the thermoplastic resin except for a flow front of the thermoplastic resin, and forming cellular porous media inside the thermoplastic resin that has been injected into the mold using the supercritical fluid. This method may modify the surface of the resin, and form fine foam cells in the resin to provide a lowered dielectric, suitable for high-frequency electric circuit boards, Mold Interconnect Devices ("MIDs"), and plane antennas, such as a millimeter-wave antenna.

The injecting step may include the steps of filling the molten resin in the mold, and introducing the supercritical fluid and material into the mold at a specific position of the mold. A dispersion of the material near the specific position near and on the surface of the resin would be able to modify the surface of the resin molded article. The method may further include the step of concentrate the material in the thermoplastic resin at the specific position by adjusting pressure and/or temperature of the mold, thereby realizing a selective surface modification of a flat molded article.

The material is, for example, an organic material or a metallic element. The organic material may be organometallic complex, and the metallic element may be metallic particles generated from the organometallic complex from which the ligand has been removed. The metal complex dissolves in the supercritical fluid to some extent, and thus may segregate on and near the surface of the molded article without deteriorating flatness of the molded article. The adhesion of the resin surface to the plating improves without a pretreatment by removing an organic part in the metallic complex and precipitating the metallic element.

The material may be organometallic complex from which the ligand is removed, and the method may further include the step of forming a pattern as a plated layer at part where the metallic element has separated out using electroless plating. The electroless plating may easily form the metal conductive film. The pattern may include concave and convex parts, and the method may further include the step of removing the convex part of the pattern after the forming step. The part may include concave and convex parts, and the method may further include the step of removing the convex part of the part before the forming step. Either method may form a desired pattern.

The method may further include compressing the thermoplastic resin after the injecting step, and increasing a volume of a cavity in the mold after the compressing step and expanding the thermoplastic resin. This method may modify the surface of the resin, and form fine foam cells in the resin to lower dielectric, suitable for high-frequency electric circuit boards. Mold Interconnect Devices ("MIDs"), and plane antennas, such as a millimeter-wave antenna.

The injecting step may use a stamper to be compressed against the thermoplastic resin that has filled up the cavity, and the stamper has a first surface that includes a predetermined pattern and is to be compressed against the thermoplastic resin, and a second surface that is opposite to the first surface and has a perforation connected to the pattern on the first surface. A formation of a pattern using a stamper would easily change a wiring circuit. A pattern formed at a specific position would be able to create a desired circuit pattern.

A mold according to another aspect of the present invention is used to manufacture a molded article by injection-molding the thermoplastic resin and includes a mechanism for introducing, as counterpressure, supercritical fluid and a material dissolved in the supercritical fluid into the mold. This mold uses the supercritical fluid and the material as counterpressure, and thus exhibits operations similar to the above.

A mold of another aspect of the present invention is used to manufacture a molded article by injection-molding the thermoplastic resin, and includes convex or concave part that is formed at a specific position on a cavity forming surface of the mold, and connected to an inlet for injecting supercritical fluid and a material dissolved in the supercritical fluid from the outside. The concave or convex part may enhance local adhesions of the material.

An injection molding apparatus of another aspect of the present invention includes a mold that forms a cavity to be filled with thermoplastic resin, a plasticization cylinder that introduces the molten resin into the cavity in the mold, and a mechanism for introducing the supercritical fluid and a material dissolved in the supercritical fluid into a flow front of the thermoplastic resin. This injection molding apparatus may include the supercritical fluid in the flow front of the resin, and exhibit operations similar to those of the above methods.

An injection molding apparatus of another aspect of the present invention includes a mold that forms a cavity to be filled with thermoplastic resin, a plasticization cylinder that introduces the molten resin into the cavity in the mold, and a mechanism for introducing the supercritical fluid into part of the thermoplastic resin except for a flow front of the thermoplastic resin. This injection molding apparatus may include the supercritical fluid in the resin at part except for the flow front, obtain an effect of inner cellular porous media, and exhibit operations similar to those of the above methods.

An injection molding apparatus of another aspect of the present invention includes a mold that forms a cavity to be filled with molten resin, and a mechanism for introducing supercritical fluid and a material dissolved in the supercritical fluid as counterpressure into a mold. This injection molding apparatus introduces the supercritical fluid and the material as counterpressure, and exhibits operations similar to those of the above methods.

An injection molding apparatus of another aspect of the present invention includes a mold that forms a cavity to be filled with molten resin, and has an inlet connected to a specific position in the cavity, and a mechanism for introducing, into the cavity through the inlet, supercritical fluid and a material dissolved in the supercritical fluid. This injection molding apparatus disperses the material near the specific position on or near the surface of the resin, and locally modifies a surface of the resin molded article.

An injection molding apparatus of another aspect of the present invention includes a mold that forms a cavity to be filled with thermoplastic resin, a stamper to be compressed against the thermoplastic resin that has filled up the cavity, the stamper having a first surface that forms a predetermined pattern and is to be compressed against the thermoplastic resin, and a second surface that is opposite to the first surface and has a perforation connected to the pattern on the first surface at a specific position, and a mechanism for introducing, through the perforation in the stamper, an organic material dissolved in supercritical fluid into the cavity. A formation of a pattern using a stamper would easily change a wiring circuit, and a formation of a pattern at a specific position would form a desired circuit pattern.

Other objects and further features of the present invention will become readily apparent from the following description of preferred embodiments with reference to accompanying drawings.

BRIEF DESCRIPTION OF THE DRAWINGS

FIG. 9 is a partial enlarged view of a mold for explaining another example of electroless plating method shown in FIG. 2.

DETAILED DESCRIPTION OF THE PREFERRED EMBODIMENTS

Figure 2:
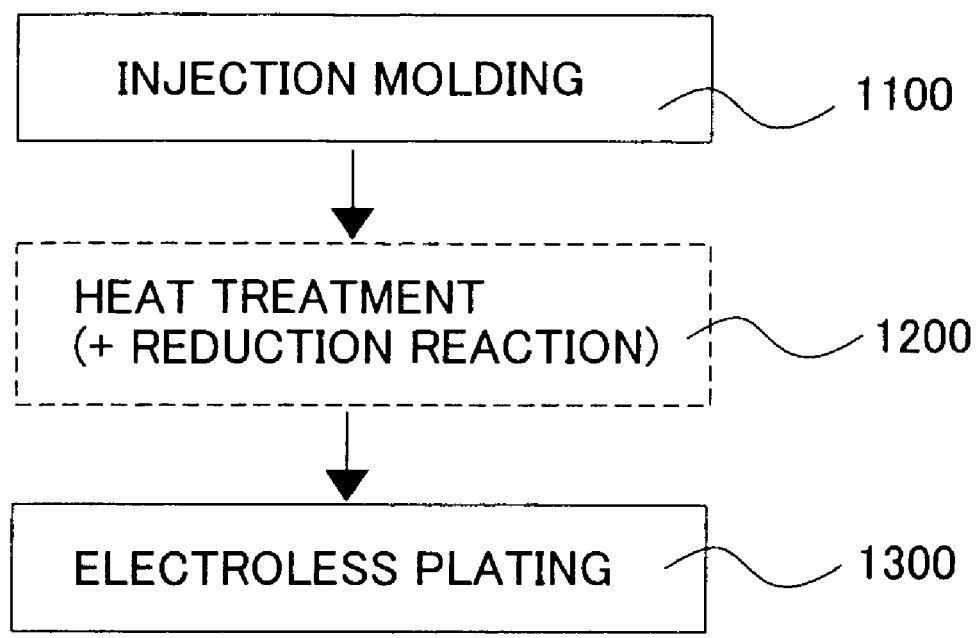
FIG. 2 is a flowchart of an electroless plating method to a plastic surface according to the present invention.

FIG. 2 shows a flowchart of electroless plating wiring to plastic of one embodiment according to the present invention. The electroless plating method of this embodiment modifies a surface of a molded article using injection molding (step 1100).

One embodiment fills a mold with molten resin, supercritical fluid and a material, such as organic material and metallic element, e.g., organometallic complex in this embodiment, dissolved in the supercritical fluid, while arranging the supercritical fluid and material at a flow front, as well as introducing the supercritical fluid and the material as counterpressure. Here, the counterprssure is gas in the mold in a direction opposite to the flow direction of emitted molten resin.

Since the molten resin at the flow front part is drawn along the mold surface and forms a surface layer due to a fountain flow effect of the flowing resin in the mold, the material that dissolves into the supercritical fluid and impregnates in the flow front in the resin localizes in a layer near the surface that contacts the mold. The material that is soluble in the supercritical fluid would to some extent would uniformly disperse into and localize only on and near a surface of the mold. Therefore, various applications may be expected to plastic surface modification technologies.

The thermoplastic resin is not limited, but may use polycarbonate, polymethyl methacrylate, polyether imide, polymethyl pentene, amorphous polyolefin, polytetrafluoroethylene, liquid crystal polymer, styrene resin, polymethyl pentene, polyacetal, etc. or a combination of some of them, or polymer alloy that has a principal constituent of them, and one that compounds various types of filler with them.

The usable supercritical fluid may arbitrarily include air, $CO_2$, butane, pentane, methanol, etc., but $CO_2$ is preferable because it has solubility similar to that of n-hexane, serves as a plasticizer to certain thermoplastic resin materials, and is famous for high performance in injection molding and extrusion molding.

Then, organometallic complex ligand that segregates at a projection on a plastic molded article is removed through heating and a reduction reaction, whereby metallic fine articles separate out (step 1200). Then, the electroless plating follows only for the projection (step 1300).

Since the electroless plating wiring in this embodiment severs a bond between the organic part and the metallic part in metallic complex after the injection molding, a posttreatment may be sometimes needed, such as a reduction reaction and heating. However, the posttreatment is unnecessary for certain types of metallic complex since the heat of the resin severs the bond while the metallic complex contacts the hot molten resin, and metallic fine particles of several nm to tens of μm automatically separate out. The type of metallic complex is arbitrary, but is preferably Pd complex, Ni complex, Co complex, Pt complex, or the like, more specifically, dimethyl platinum (cyclooctadiene), bis (cyclopentadienyl) nickel, bis (acetylacetnate) paradium, etc. Pd complex and Pt complex are preferable since they may dispense with a reduction reaction. After the metallic fine particles separate out on the surface of the injection-molded article, the electroless plating (step 1300) may use any known technology, and a detailed description thereof will be omitted. Use of an electroless plated layer would form, for example, an electric wiring pattern.

Figure 3:
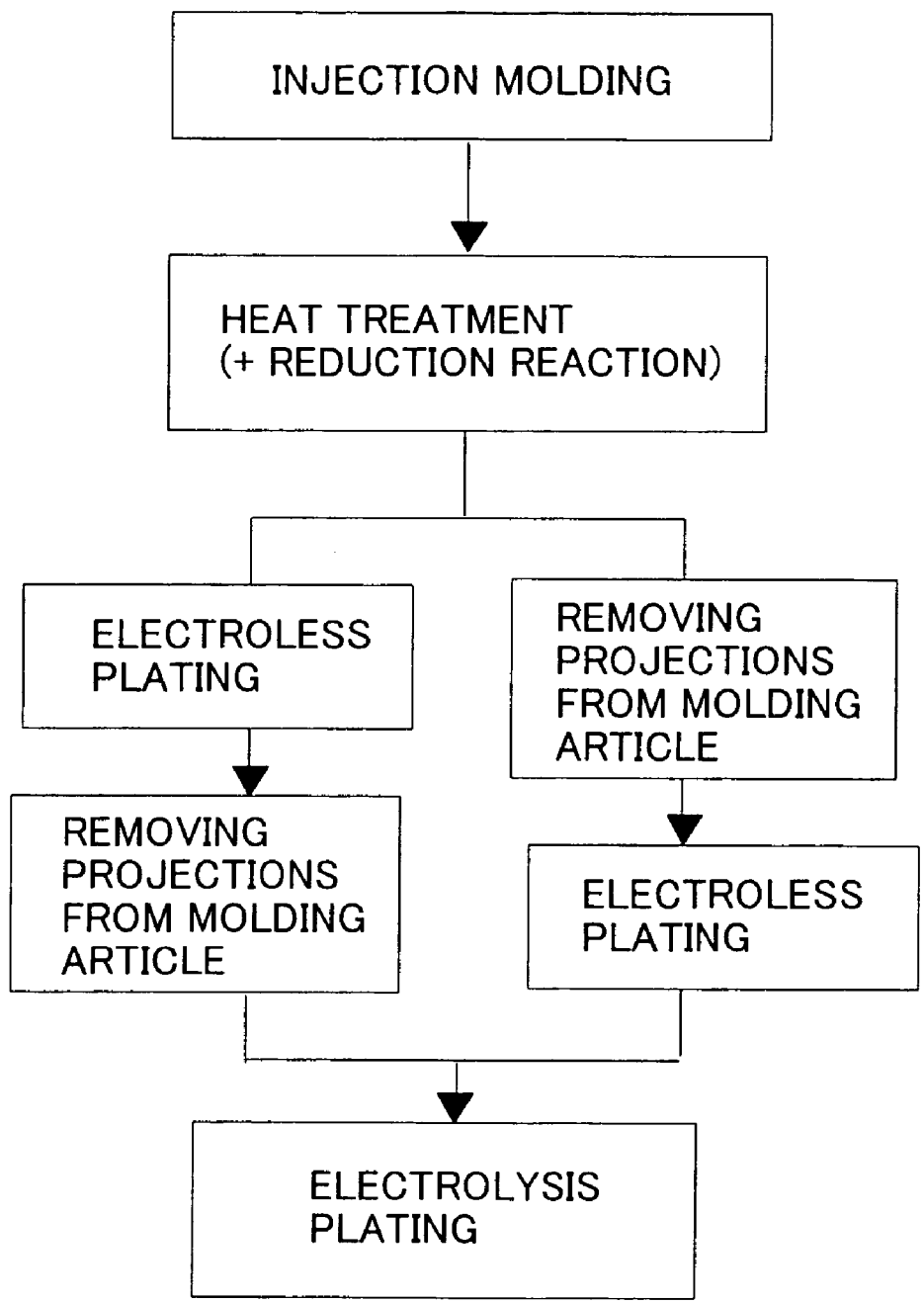
FIG. 3 is a flowchart of a fine plating wiring method to the plastic surface in the method shown in FIG. 2.

The instant embodiment may inexpensively and cleanly form fine wiring by using the electroless plating, and applying plastic surface modification technologies in the injection molding, and FIG. 3 shows this flow. The present invention is characterized in applying the above injection molding method as well as transferring concaves and convexes to form plated wiring on a surface of the molded article. For example, two alternative methods are applicable as shown in the flowchart in FIG. 3. A description will be given of these two methods with reference to FIGS. 8 and 9.

Figure 8C:
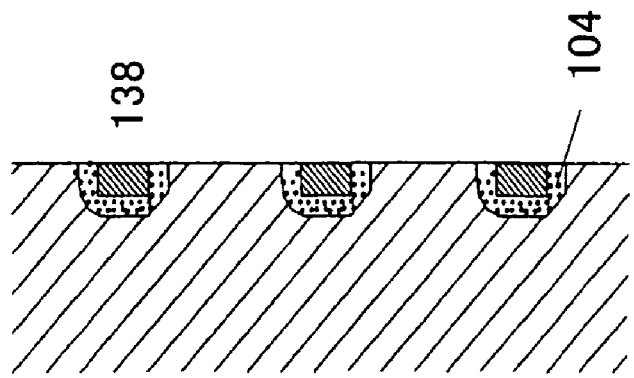
FIG. 8 is a partial enlarged view of a mold for explaining one example of electroless plating method shown in FIG. 2.
Figure 8B:
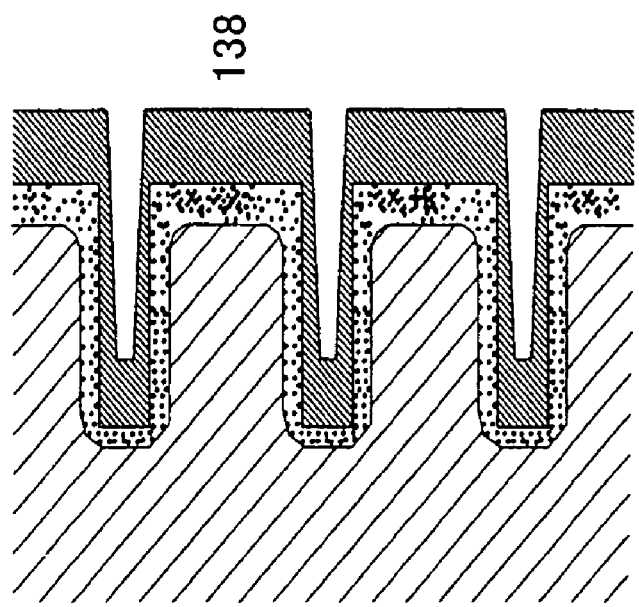
Figure 8A:
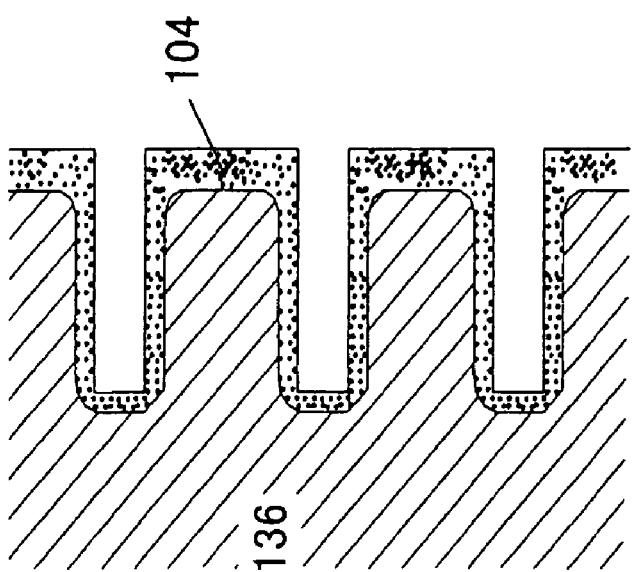

FIG. 8 shows a conceptual view of one example of an inventive plating wiring method. According to this method, metallic fine particles 104 that serves as catalyst cores segregate on the entire surface of the molded article 136, as shown in FIG. 8A, then electroless plating 138 is layered on the molded-article surface as shown in FIG. 8B, and finally a wiring pattern is formed by removing convex electroless plated part through polishing, etc. to leave concave electroless plating, as shown in FIG. 8C. The present invention may use any method to remove concave pattern, such as polishing and wrapping.

FIG. 9 shows a conceptual view of another example of an inventive plating wiring method. This method initially localizes the metallic complex or metallic fine particles near the surface using the above injection molding, and manufactures a molded article onto which convexes and concaves on a mold or stamper surface has been transferred, followed by a complete removal of organic matters through any necessary thermal treatment and reduction reaction. After the convex parts on the molded article is removed, the metallic fine particles 104 that serve as catalyst cores for plating localize only in the concave part as shown in FIG. 9B. Therefore, the electroless plating 138 is locally layered, as shown in FIG. 9C, by applying the electroless plating to the entire molded article 136. These methods in FIGS. 8 and 9 may achieve an object to inexpensively form fine wires on a plastic surface using electroless plating.

The step 1100 in the other embodiment impregnates the supercritical fluid and material in the concave part in the mold after filling the mold with molten resin. The viscosity of the resin that contacts the supercritical fluid lowers and the organic matters dissolved in the supercritical fluid permeates into the resin from its surface.

Then, the resin is completely loaded into the concave part by dwell, clamping pressure, or the like to increase the internal pressure of the resin, and the concave part is formed which arranges the organic matters near and on the surface of the molded article. According to this method, the organic material that is soluble in the supercritical fluid to some extent would uniformly disperse and arrange only in convex part near a surface of the molded article. Therefore, various applications may be expected to plastic surface modification technologies. Use of $CO_2$ as the supercritical fluid would serve as a plasticizer as discussed, and easily transfer such a fine concave and convex pattern as a pitch of a submicron order.

After the supercritical fluid and the organic metallic complex dissolved in the supercritical fluid are injected, at least one of the metallic complex and metallic fine particles from the metallic complex from which the ligands of the metallic complex are removed is infiltrated into the thermoplastic resin from the concave part in the mold and the resin surface. Thereby, the metallic complex or metallic fine particles selectively settle at loaded concave part in the mold or only at the convex part in the plastic molded part. According to this method, the mold surface does not have to be roughed, and metal complex etc. may be arranged selectively at a fine area.

Even when the resin does not have a polar group and is made of a material that cannot easily form a strong electroless plated layer, the metallic fine particles as catalyst cores may be embedded easily into the material, and thus a high-quality electroless plated film may be formed which has good adhesion property at an arbitrary selected portion. The wiring process using the electroless plating of the instant embodiment is harmless in comparison with the conventional method, and has a remarkable easy pretreatment step.

The present invention is not limited to such electroless plating. The present invention may manufacture sufficiently beneficial molded articles only by using the injection molding method (step 1100). For example, an entire or local arrangement of metallic fine particles on the plastic surface would wholly and selectively provide conductivity and magnetism to the plastic surface. Use of this plastic would easily seal a biochip, or easily seal between the plastic and a glass plate etc. after adhering the plastic having fine concave and convex parts as a channel for fluid, to the glass plate etc. to magnetize the rear surface of the glass plate.

The organic material used for the present invention in the injection molding method (step 1100) is not limited to the organometallic complex. For example, when the organic material uses polypropylene glycol, a hydrophobic plastic surface, such as polyethylene terephthalate, may be selectively made hydrophilic. An entirely or selectively hydrophilic or hydrophobic plastic channel surface in the biochip would provide the blended fluid in the chip with a highly efficient laminar flow, trap protein there for analysis, or the like. Similarly, use of a fluorine compound would provide entire or selective water repellency and reduce refractive index.

The present invention may include the step of compressing the molten resin using dwell, clamping pressure, or the like, and then increasing a volume of a cavity to expand the molten resin. This method may modify the plastic surface, and simultaneously form fine foam cells in the resin to lower dielectric. The average cell diameter in this case is preferably equal to or less than 30 μm, and an expansion ratio of 1.5 or larger, to make the plastic molded article lightweight, enhance its adiabatic effect, and improve a ratio of rigidity to weight. This molded article is suitable for high-frequency electric circuit boards Mold Interconnect Devices ("MIDs"), and plane antennas, such as a millimeter-wave antenna.

A description will now be given of examples of the present invention:

EXAMPLE 1

Figure 1:
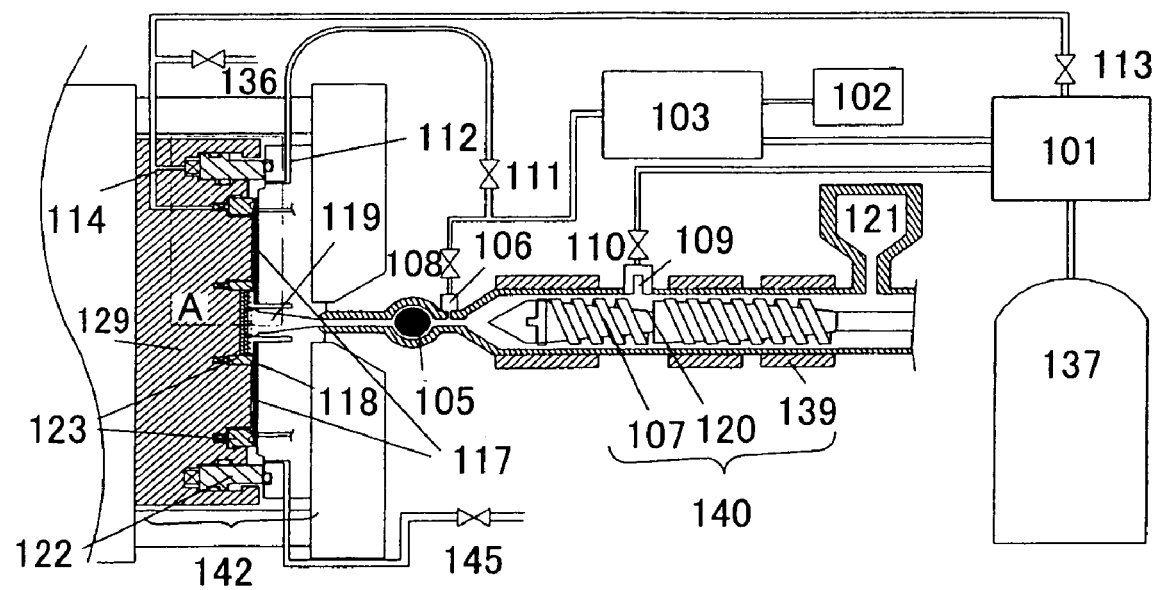
FIG. 1 is a sectional view of principle part of an injection molding apparatus of one embodiment according to the present invention.

FIG. 1 shows a sectional view of principle part of a mold and injection molding apparatus used for the first embodiment. The present invention does not limit a type of supercritical fluid, but the instant embodiment used $CO_2$. In addition, the present invention does not limit a type of material dissolved in the supercritical fluid, but the instant embodiment used dimethyl platinum (cyclooctadiene).

Any method may be used to dissolve the material in the supercritical fluid, but the instant embodiment uses a supercritical fluid generator 101 to make supercritical $CO_2$ supplied from a $CO_2$ cylinder 137, and then dissolves into the supercritical fluid a material supplied from a storage container 102 in a mixing tank 103.

The present invention may use any pressure and temperature of the supercritical fluid that dissolves the material and any method of introducing molten resin into the flow front part, but the instant embodiment introduced supercritical $CO_2$ and the dissolved material at 120° C. and 10 MPa into a cavity as counterpressure that applies pressure in a direction opposite to a flow direction of the thermoplastic resin, and impregnates them into the flow front part of the molten rein in the plasticization cylinder 140. The counterpressure is lower than the pressure of the resin injected from a spool at the time of filling. The resin pressure, as used herein, means actual resin pressure in the mold, but is not monitored usually. Usually, the resin pressure means the pressure of molding machine to extrude a screw. The latter pressure is about 100 to 200 MPa, much larger than the counterpressure, while the former pressure is about 20 MPa. The counterpressure may be large enough to provide the gas injected into the mold with a supercritical state, for example, about 7 PMa or larger for $CO_2$. The upper limit is equal to or smaller than the pressure that enables the resin to be injected, and depends upon the materials and molding conditions. The present invention may use any method for introducing, into a cavity 117 in the mold, as counterpressure the supercritical fluid and the material dissolved in the supercritical fluid, but the instant embodiment introduced from the mixing tank 103 through a channel 112 by opening a magnetic valve 111 at the same time when the injection filling starts after the cavity 117 is closed.

The present invention may use any method for infiltrating the supercritical fluid and material dissolved in the supercritical fluid into the flow front part of the molten resin after the plasticization metering in the plasticization cylinder 140, and a description will be given of a method of the instant embodiment with reference to FIGS. 1 and 7. The plasticization metering is the step of plasticizing a resin pellet in a short time by a rotation of a screw, and of storing a certain volume for the next injection filling before the screw.

Figures 7A, 7B:
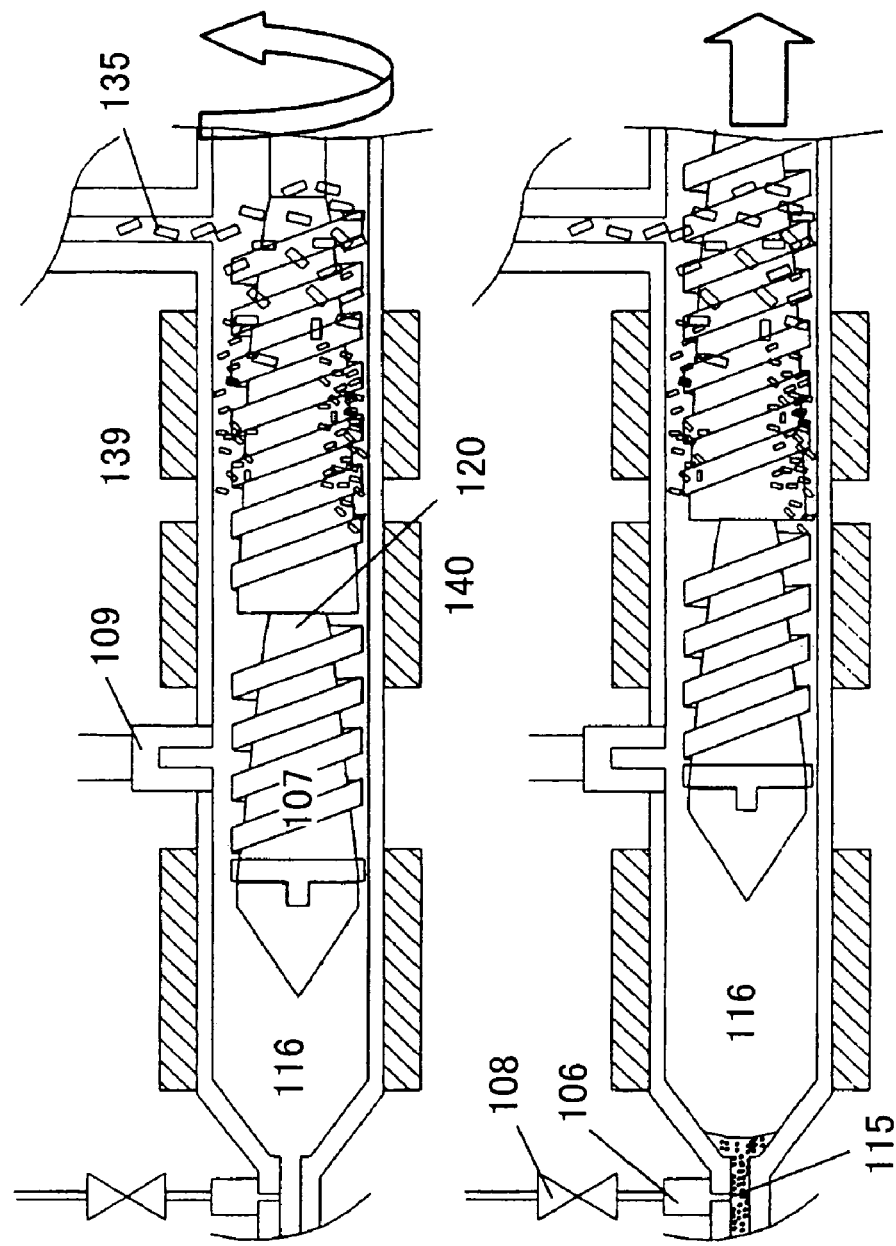
FIG. 7 is an enlarged view of an injection mechanism in the injection molding apparatus shown in FIG. 1.

When a screw 107 rotates in an arrow direction in FIG. 7A in the plasticization cylinder 140 that has been temperature-controlled by a band heater 139, a pellet 135 of the thermoplastic resin is supplied from a hopper 121, plasticized and extruded in front of the screw 107, and the screw 107 retreats accordingly. The screw 107 stops retreating at a metering position, and the molten resin 116 is plasticization-metered between the screw 107 and shutoff nozzle 105. The shutoff nozzle 105 is a mechanism for opening and closing a fluid channel between a mold and a cylinder, and serves to prevent the molten resin from inserting into the mold even when the internal pressure in the cylinder increases. The screw 107, also referred to as an in-line screw, serves to plasticize a pellet and to eject the pellet. After the plasticization metering, sucking back retreats the screw 107, as shown in FIG. 7B, to decrease pressure of the front part of the molten resin, and the supercritical fluid and the material dissolved in the supercritical fluid are introduced by opening an electromagnetic valve 108 through an inlet 106 of the mixture between the shutoff nozzle 105 and the screw 107. After the electromagnetic valve closes, the pressure of 10 MPa pressurizes and advances the screw 107 to infiltrate the supercritical fluid and material dissolved in the supercritical fluid into the flow front of the molten resin. Then, the injection filling follows at once.

While the present invention may use any thermoplastic resin, the instant embodiment uses polyether imide with a glass-transition temperature of about 230° C. (GE Plastics, ULTEM 1010). The temperature of the plasticization cylinder is maintained at 380° C.

While the inventive injection molding method is not limited except for impregnating supercritical fluid and the material dissolved in the supercritical fluid into the flow front of the molten resin, the instant embodiment uses injection compression molding that opens a cavity in filling and applies clamping pressure just after the filling. In addition, a mold seal mechanism is devised which does not leak the supercritical fluid even when the cavity opens while the supercritical fluid is being introduced as counterpressure. The molding method and mold structure may realize fine transfers for molding retardant materials with high glass-transition temperature and thin articles in which the resin is hard to flow.

Figure 4:
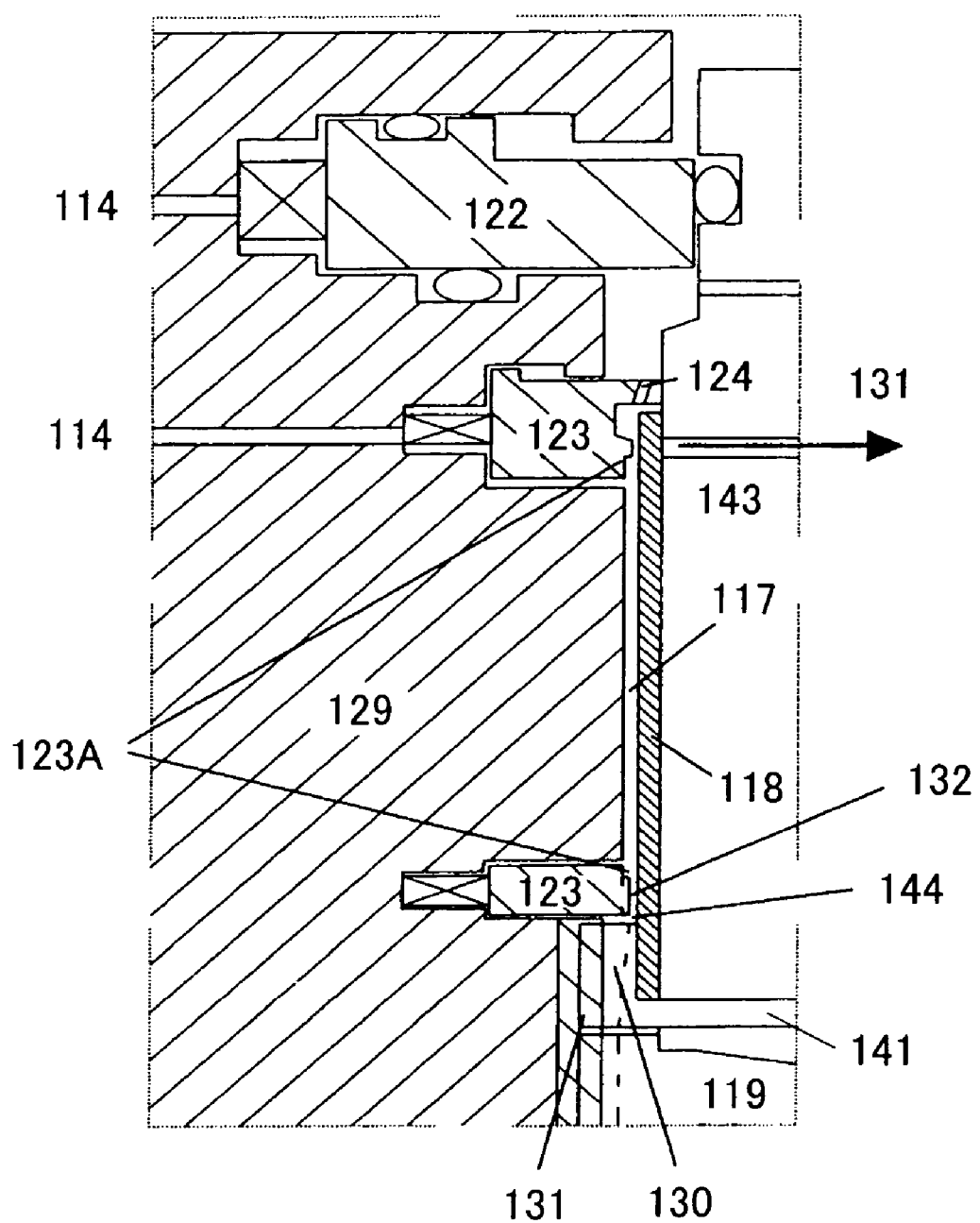
FIG. 4 is an enlarged view of part A shown in FIG. 1.
Figure 5:
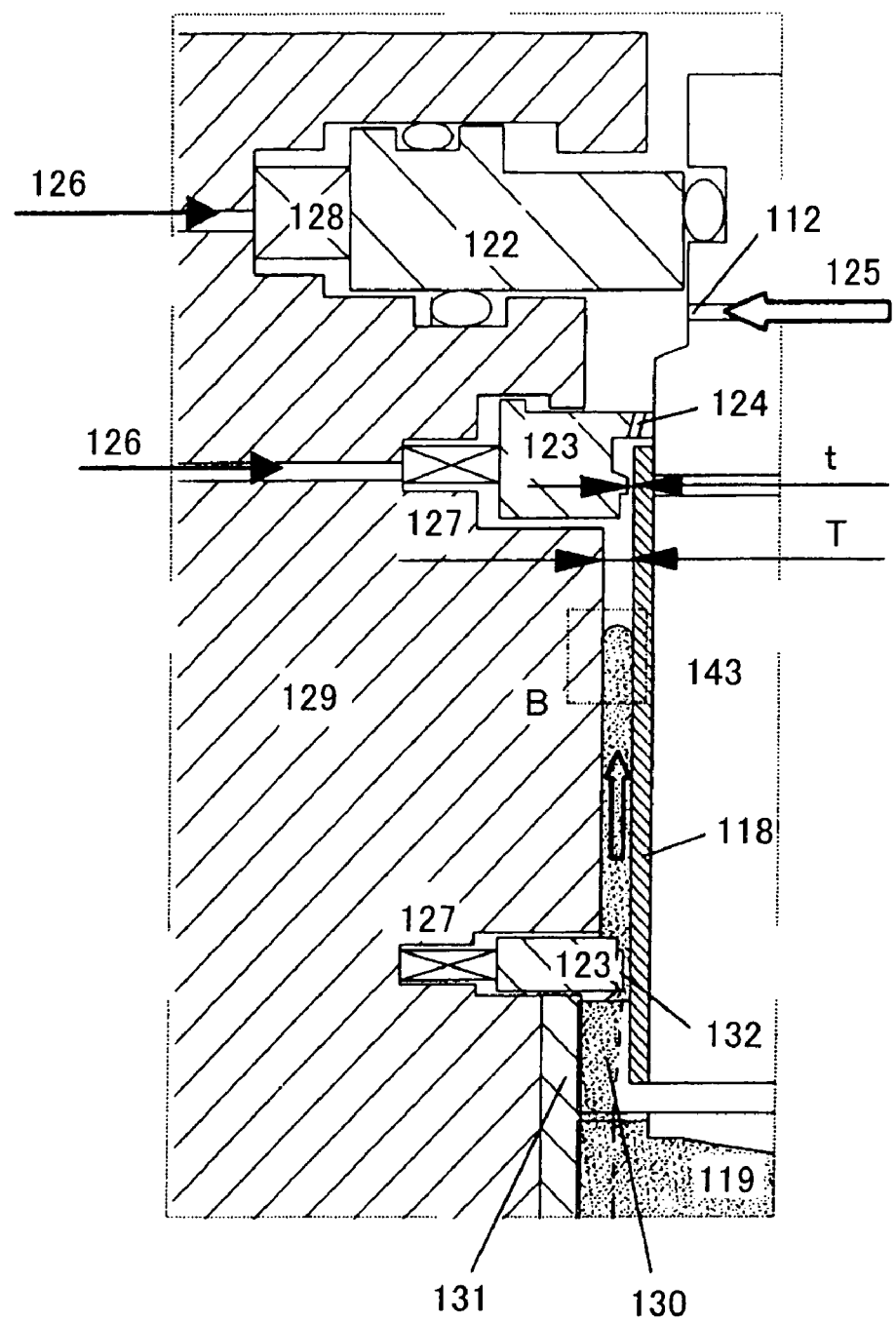
FIG. 5 is a sectional view for explaining operations of a structure shown in FIG. 4.

A detailed description will now be given of a molding method of the instant embodiment, with reference to FIGS. 1, 4 and 5. FIGS. 4 and 5 are enlarged views of principle part of the mold at part "A" in FIG. 1. The instant embodiment simultaneously molds two pieces of plate-shaped products with a size of length 50 mm×width 60 mm×thickness 0.5 mm. While a mold 142 that includes a front cavity (also referred to as cavity side part or cover mold) 143 and a rear cavity (also referred to as movable half) 129 is temperature-controlled by coolant that flows in a temperature control circuit (not shown), the instant embodiment adjusts the temperature to 140° C.

As shown in FIG. 1, each cavity 117 in the mold 142 is divided into upper and lower parts with respect to a spool 119, and a rectangular stamper 118 corresponding to the cavity 117 is provided on the front cavity 143. A surface of the stamper 118 is provided with a line-and-space convexo-concave pattern. The stamper is formed by the steps of forming concaves and convexes on a silicone substrate using photolithography and resist, and then forming Ni with a thickness of 0.4 mm on a resist pattern using electrolysis plating and electroless plating. Ni is removed from the resist, and shaped into a stamper.

As shown in FIG. 4, one side of the stamper 118 at the side of the spool 119 is mechanically fixed onto the front cavity 143 by a stamper presser tab 141, and the other three sides are absorbed on the front cavity 143 by vacuum drawing from a vacuum groove 131. A runner groove 130 is provided on the stamper presser tab 141 and connected to the spool 119 so as to flow the molten resin. Convex part 131 is provided on the rear cavity 129 opposite to the runner groove 130, and inserted into a groove 130. Even when the cavity 117 opens to some extent, the filled resin does not overreach the runner groove 130.

A perimeter frame 123 for defining a perimeter of the product is provided on the rear cavity 129 opposite to the stamper 118 and may be independently driven in a cavity opening/closing directions. The perimeter frame 123 is stepped, and an edge 123A defines a perimeter. One side in the perimeter frame 123 at the side of the spool in a filling start direction is provided with a groove 132 connected to the runner groove 130, and the molten resin is filled in the cavity 117 through the groove 132 after passing through the gate 144.

The instant embodiment opened the cavity with a thickness T of 3.0 mm as shown in FIG. 5 at the time of filling, and controls the clamping pressure so that the open amount may be constant during filling. The electromagnetic valve 111 opens simultaneous with a start of filling, as discussed, and the supercritical fluid and the material dissolved in the supercritical fluid are introduced in the mold and cavity 117 with pressure of an arrow 125 in FIG. 5 through a channel 112. Simultaneously, the electromagnetic valve 113 shown in FIG. 1 opens, and only the supercritical fluid is introduced through a channel 114 into the mold and pressurizes rear surfaces of the movable butt ring 122 and perimeter frame 123 as shown by an arrow 126 in FIG. 5. As a result, the pressures 125 and 126 of the supercritical fluid are balanced. Springs 127 and 128 are respectively provided at the back of the movable butt ring 122 and perimeter frame 123, and thus these members contact the front cavity 143 due to spring forces. The seal maintains even when this mechanism opens the mold, and thus the high-pressure supercritical fluid does not leak out of the mold. The filled resin does not overreach the perimeter frame 123 that defines the perimeter of the product.

The supercritical fluid and the dissolved material that have been introduced as counterpressure with pressure 125 pass through a perforation 124 in the perimeter frame 123 and clearance "t" between the stamper 118 and the perimeter frame 123, and is loaded in the cavity 117. The instant embodiment sets the clearance t to be 10 µm.

Figure 6:
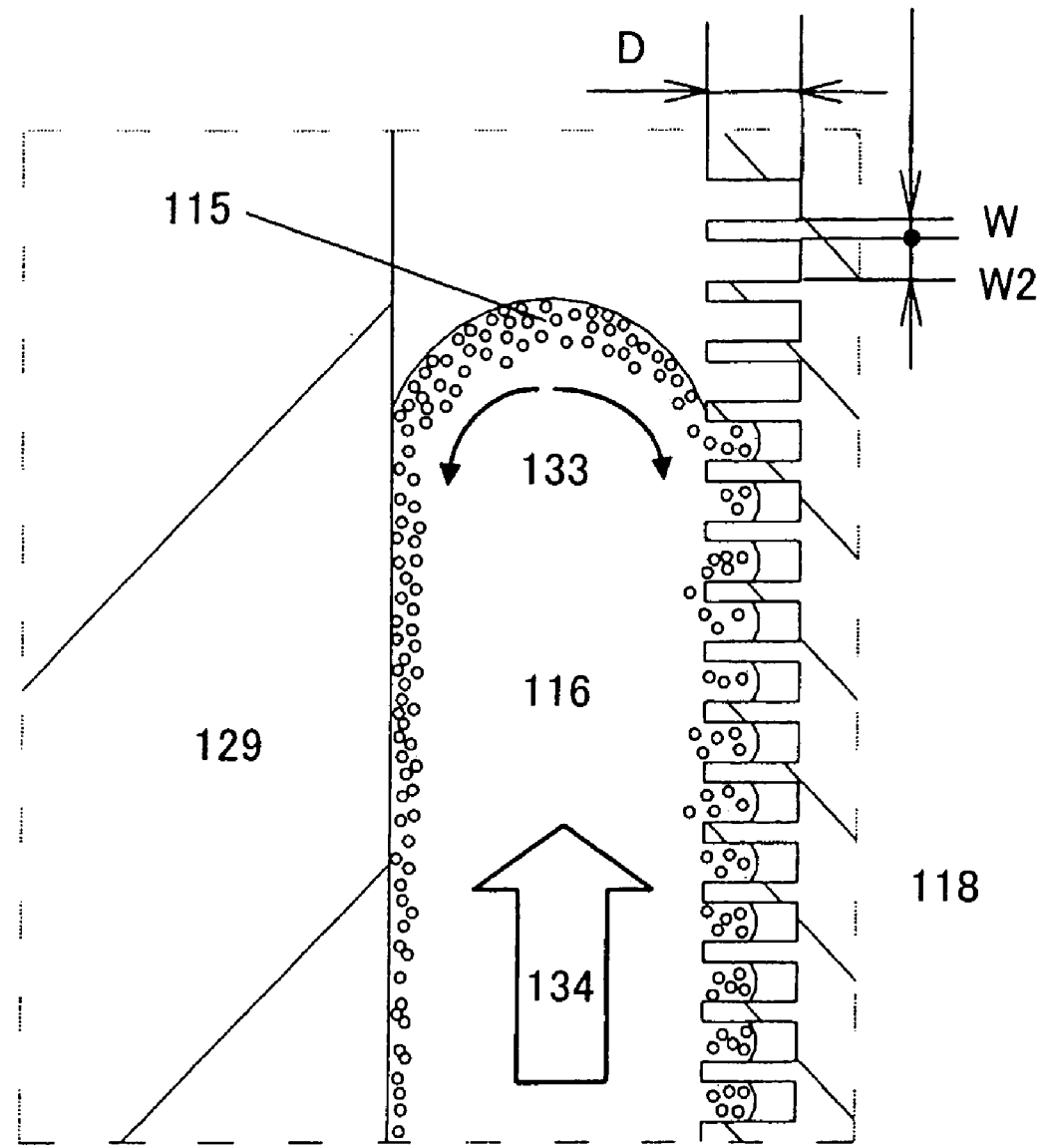
FIG. 6 is an enlarged view for explaining a flow front in injection filling of part B shown in FIG. 5.

The molten resin that contains supercritical fluid and the melt at its flow front part is filled in the cavity 117 that opens as shown in FIG. 5 from the spool 119 as the screw 107 advances just after the shutoff nozzle 105 shown in FIG. 1 releases. FIG. 6 schematically shows a state of the resin during filling. The supercritical fluid and the material 115 dissolved in the supercritical fluid localize along wall surfaces of the stamper 118 and rear cavity 129 at the flow front 133 of the molten resin 116 that flows in a direction of the arrow 134 due to the fountain flow phenomenon. Both the material that have previously been impregnated in the resin and the material that has been introduced as counterpressure localize on and near the surface of the molded article for the same effect.

When the supercritical fluid has previously infiltrated into the resin to be filled, the pressure decrease of the supercritical fluid and associative expansion may be restrained by introducing the supercritical fluid and pressurized $CO_2$ as counterpressure. Therefore, even when only the flow front part of the molten resin contains the supercritical fluid and the material dissolved in the supercritical fluid, it is preferable to introduce only the supercritical fluid into the cavity as counterpressure. Even when no counterpressure is used, the insulation is preferable using a low heat conduction material, such as polyimide, formed on a surface of the mold and release surface of the stamper, so as to prevent an increase of the resin viscosity and a pressure drop of the supercritical fluid.

A concavoconvex pattern on the stamper 118 schematically shown in FIG. 6 has a dimension of widths W of 2 μm and W2 of 5 μm, and a depth D of 30 μm in the instant embodiment. The instant embodiment appears to be insufficient to transfer a pattern with a high aspect ratio as shown in FIG. 6 in injection filling, but the complete transfer is available by applying the clamping pressure of 40 ton just after the filling, which compresses the cavity open amount T as a thickness of the product from 3.0 mm to 0.5 mm.

The molding method of the instant embodiment opens the cavity in injection, reduces the flow resistance of the molten resin in the mold, and shortens the flow length in the cavity. The volume compression of the cavity just after the filling would enhance again the pressure of the supercritical fluid which has been reduced in filling, and maintains the surface viscosity of the resin to a low state. In addition, the supercritical fluid that has been introduced as counterpressure and tends to remain in a fine pattern may be impregnated into the molten resin. This method may realize fine transfers even in the molding retardant material and structure, and make the pressure distribution uniform in the cavity.

The instant embodiment opens the electromagnetic valves 145 and 136 in FIG. 1 after injection compression, leaks $CO_2$ in the cavity, resin and mold, hardens the molten resin in the mold, and then takes out the product by opening the mold. It may be confirmed that Pt complex as the material dissolved in the supercritical fluid and Pt fine particles from Pt complex from which the organic matters have been removed localize on and near the surface of the molded article manufactured by this embodiment. It is also confirmed that the central part of the molded article contains little material.

The present invention may conduct a posttreatment, such as heating and a reduction reaction, after the material dissolved in the supercritical fluid, such as metal complex, localizes on and near the surface of the molded article using the above method, but the instant embodiment does not conduct the posttreatment before the electroless plating.

The instant embodiment uses electroless copper plating for the molded article manufactured by the above injection molding method. Initially, the molded article is put in a container that contains electroless copper plating solution, i.e., Okuno Chemical Industries Co., Ltd., OPC700A of 100 ml/l+Okuno Chemical Industries Co., Ltd., OPC700B of 100 ml/l, and agitated for 60 minutes at room temperature for copper plating processing. After the cleansed, it is put in a container that contains electroless copper plating solution, i.e., Okuno Chemical Industries Co., Ltd., OPC Copper T1 of 60 ml/l+Okuno Chemical Industries Co., Ltd., OPC Copper T2 of 12 ml/l+Okuno Chemical Industries Co., Ltd., OPC Copper T3 of 100 ml/l, and agitated for 120 minutes at temperature of 60° C. followed by air agitation for copper plating processing. After it is cleansed with supersonic waves, pure water and methanol, the copper plated film is formed with a thickness of 10 μm on the entire surface of the molded article. It may be confirmed that the copper plated film has a uniform thickness without swell, and exhibits practically satisfactory adhesive strength in a peel test.

As shown in a schematic view shown in FIG. 8, a surface of the pattern forming surface of the molded article shown in FIG. 8B is polished by 20 μm, and its convex portions are removed as shown in FIG. 8C, leaving the electroless plated film only in the concave parts, and forming a wiring pattern. It may be confirmed that the molded article of this embodiment forms electroless copper plated wiring having a width of 2 μm without defects. It may be also confirmed that it exhibited good insulation property between adjacent wires.

EXAMPLE 2

The injection molding and wiring using electroless plating similar to those shown in FIG. 1 are conducted except that the electroless plating was pursuant to FIG. 9 after the molded article is manufactured. It may be confirmed that the molded article of this embodiment forms electroless copper plated wiring having a width of 2 μm without defects. It may also be confirmed that it exhibits good insulation property between adjacent wires.

EXAMPLE 3

The injection molding is conducted similar to those shown in FIG. 1 except that supercritical $CO_2$ is impregnated into the molten resin other than its flow front part and cellular porous media are formed in the molded article. The instant embodiment manufactures an inner cellular porous media as follows:

The supercritical $CO_2$ is introduced to bent part 120 of the screw 107 by opening the electromagnetic valve 110 from the inlet 109 of the supercritical fluid shown in FIG. 1, and the supercritical $CO_2$ that does not dissolve metal complex except for the flow front part was impregnated into the molten resin. After the injection filling and injection compression for transferring similar to those of FIG. 1, the pressure of $CO_2$ in the cavity is reduced down to the high clamping pressure of 5 ton without releasing that to the air so as to expand the inside of the molded article. The electromagnetic valve 136 opens at the same time of expansion to release the supercritical fluid that has been introduced into the mold into the air.

The molded article of the instant embodiment has a uniform pressure distribution in the cavity due to the injection compression effect, and fine cellular porous media are uniformly obtained on the entire surface. It may be confirmed that the molded article of this embodiment forms electroless copper plated wiring without defects, similar to the first example. It may also be confirmed that it exhibits good insulation property between adjacent wires.

Comparative Example

The injection molding and electroless plating similar to those shown in FIG. 1 are conducted except that Pt complex as a material to be dissolved is not dissolved in the supercritical fluid. The electroless plating cannot be conducted for the molded article of this comparative embodiment.

EXAMPLE 4

Figure 10:
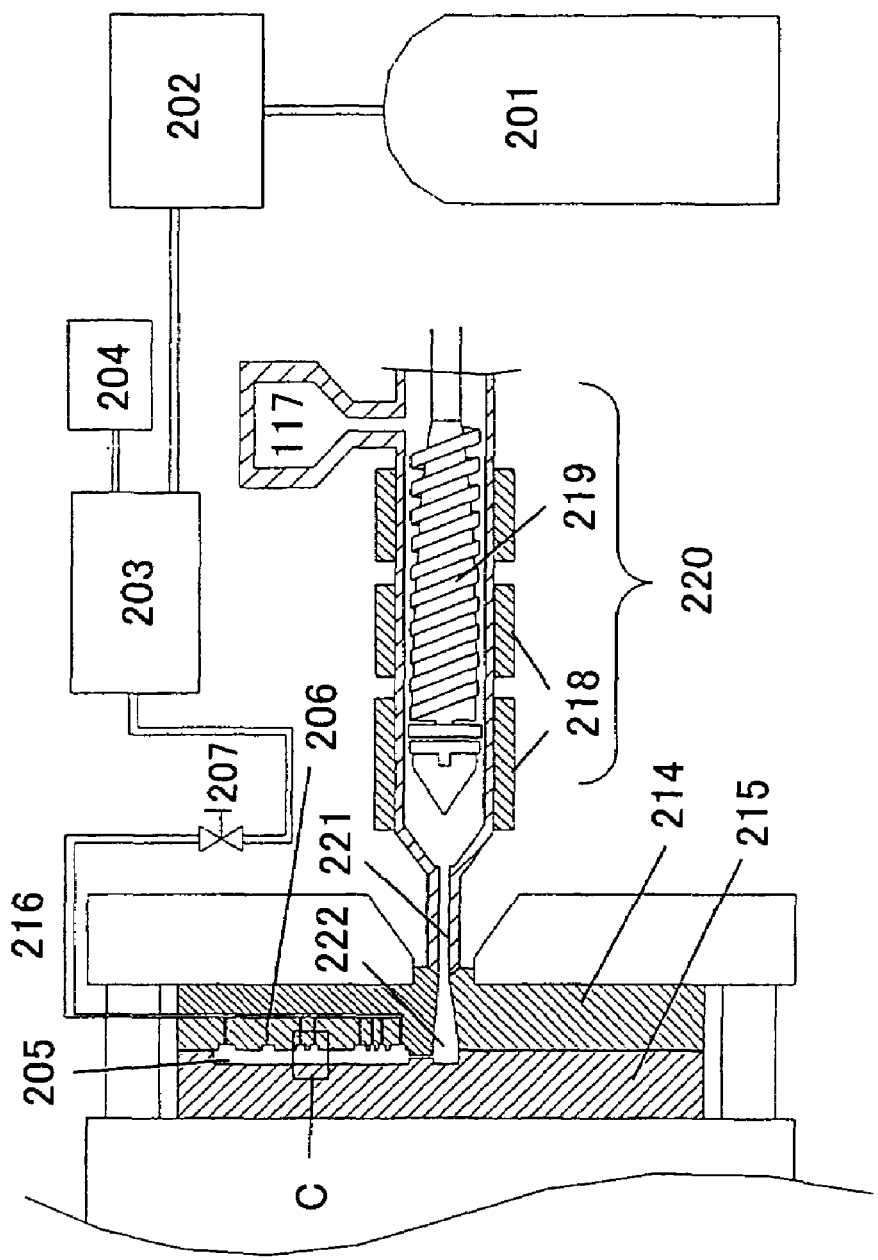
FIG. 10 is a sectional view of principle part of an injection molding apparatus of another embodiment according to the present invention.
Figure 11A:
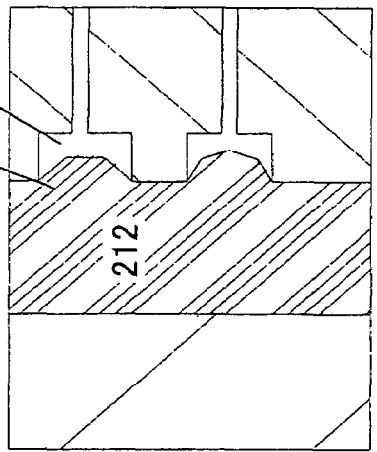
FIG. 11 is a partial enlarged view of an injection molding apparatus shown in FIG. 10.
Figure 11B:
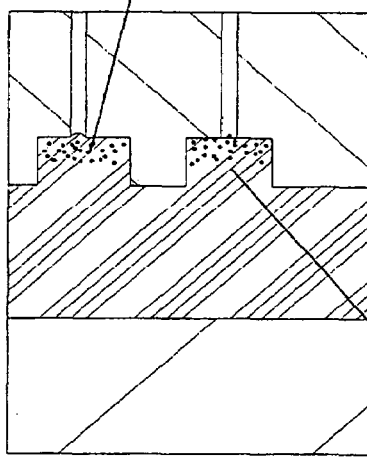
Figure 11C:
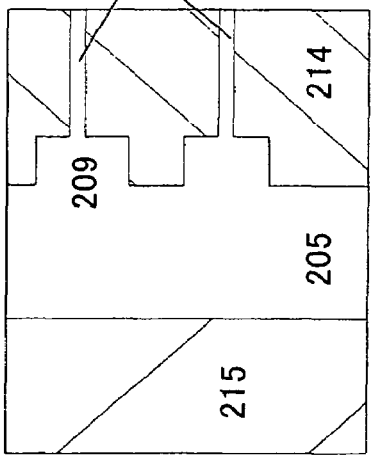
Figure 11D:
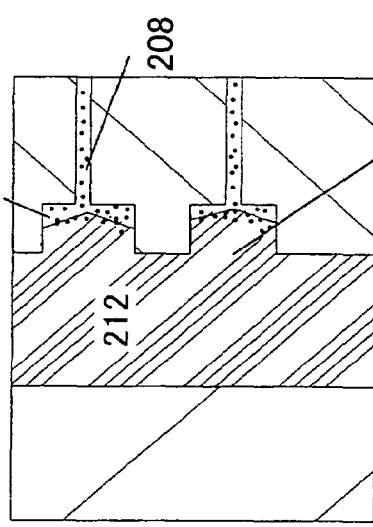

FIG. 10 shows a structural sectional view of principal part of a mold and molding apparatus used for the instant embodiment. The instant embodiment uses $CO_2$. The present invention does not limit a type of material dissolved in the supercritical fluid, but the instant embodiment uses bis (acetylacetnate) paradium.

Any method may be used to dissolve the material in the supercritical fluid, but the instant embodiment uses a supercritical fluid generator 202 to make supercritical $CO_2$ supplied from a $CO_2$ cylinder 201, and then dissolves a material supplied from a storage container 204 in a mixing tank 203, into the supercritical fluid with predetermined concentration. The mixing tank 203 in the instant embodiment maintains an atmosphere of 100° C. and 12 MPa.

The present invention may use any method for introducing, into the mold, the supercritical fluid that dissolves the material, but the instant embodiment opens the electromagnetic valve 207, and injects them through a channel 216 and a fine channel 206 in a front cavity 214 into a cavity 205 defined by the front cavity 214 and rear cavity 215. The fine channel 206 in the front cavity 214 has a diameter of Φ0.3 mm in the instant embodiment.

A detailed description will now be given of an injection molding method of the instant embodiment with reference to FIGS. 10 and 11. A known method is applied to plasticization and filling. Referring to FIG. 10, a resin pellet (not shown) is filled in a plasticization cylinder 220 through a band heater 218 and hopper 217 in response to a rotation of the screw 219, plasticization-fused and metered in front of the screw 219. The screw 219 retreats as the internal pressure increases in front of the screw 219. In injection, the screw 219 advances and fills the metered molten resin in the cavity 205 in the mold. The cavity 205 is formed between the fixed and rear cavities 214 and 215, which have been temperature-controlled by a temperature control circuit (not shown), metered measured, and the molten resin is filled in the cavity 205 through a nozzle 221 and spool 222 of the mold.

While the present invention may use any thermoplastic resin, the instant embodiment uses polyether imide with a glass-transition temperature of about 230° C. (GE Plastics, ULTEM 1010). The temperature of the plasticization cylinder is maintained at 380° C. The temperature of coolant that flows in the temperature circuit in the mold is set to be 125° C.

The instant embodiment provides a surface of the front cavity 214 with convexes and concaves connected to the channel 206. The surface of the mold of the present invention may use any concave/convex shape, any pitch and depth, etc., but the instant embodiment uses such a groove line-and-space pattern 209 with a constant depth, and random pitches and widths, where the groove has the depth of 2 mm, width of 0.9 mm, and minimum pitch of 0.6 mm.

FIG. 11 shows an enlarged view of part C of mold cavity 205 in FIG. 10 provided with the groove pattern 209. A description will be given of the method for filling the resin into the groove 209 with reference to FIG. 11. The molten resin 212 is filled, as shown in FIG. 11B, in a cavity 205 space shown in FIG. 11A that shows a pre-filled state of the cavity 205. The primary filling cannot sufficiently increase the resin internal pressure to fill the inside of the groove 209 in the mold, forming convex parts 210. The supercritical fluid 208 that dissolves the organometallic complex is injected into the groove part 209. The resin internal pressure and clamping pressure are controlled so that the supercritical fluid and the dissolved material may not leak from the groove 209 part. When the supercritical $CO_2$ contacts the molten resin, the convex part 210 of the resin in the groove 209 part softens and the metallic complex 213 easily impregnates into the resin. As shown in FIG. 11D, the resin is approximately completely filled in the groove 209 by increasing the dwell and clamping pressure. Thereby, the organometallic complex 213 localizes on and near the surface of the convex part 210 in the molded article.

The present invention may conduct a posttreatment, such as heating and a reduction reaction, after the material dissolved in the supercritical fluid, such as metal complex, localizes on and near the surface of the molded article using the above method, but the instant embodiment leaves it in a high-temperature tank of 200° C. for one hour and removes ligand from the organometallic complex. The instant embodiment uses electroless copper plating for the molded article manufactured by the above injection molding method. Initially, the molded article is put in a container that contains electroless copper plating solution, i.e., Okuno Chemical Industries Co., Ltd., OPC700A of 100 ml/l+ Okuno Chemical Industries Co., Ltd. OPC700B of 100 ml/l, and agitated for 60 minutes at room temperature for copper plating processing. After cleansed, it is put in a container that contains electroless copper plating solution, i.e., Okuno Chemical Industries Co., Ltd., OPC Copper T1 of 60 ml/l+ Okuno Chemical Industries Co., Ltd., OPC Copper T2 of 12 ml/l+Okuno Chemical Industries Co., Ltd., OPC Copper T3 of 100 ml/l, and agitated for 120 minutes at temperature of 60° C. followed by air agitation for copper plating processing. After it is cleansed with supersonic waves, pure water and methanol, the copper plated film is formed with a thickness of 10 μm on the entire surface, of the molded article. It may be confirmed that the copper plated film has a uniform thickness without swell, and practically satisfactory adhesive strength in a peel test.

EXAMPLE 5

Figure 12:
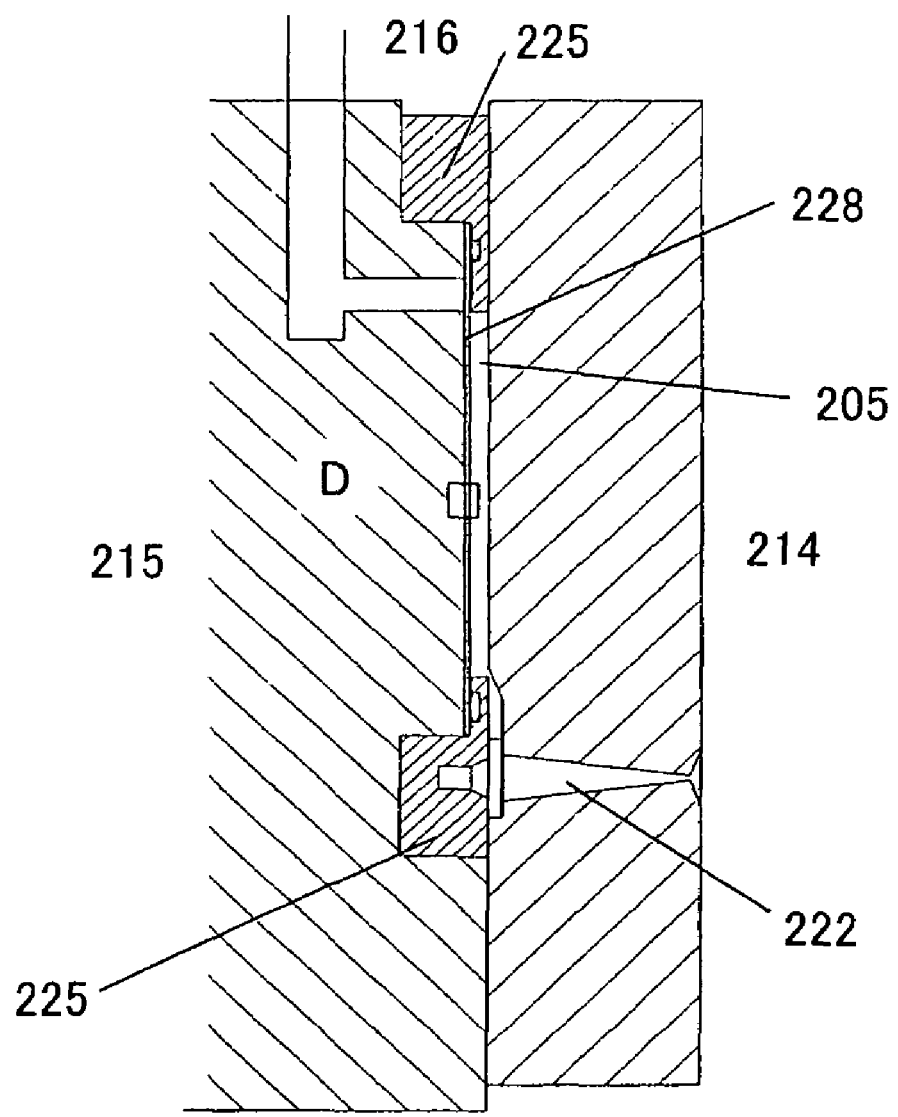
FIG. 12 is a sectional view of principle part of an injection molding apparatus of still another embodiment according to the present invention.

This embodiment used a molding machine similar to that of the fourth example except that a mold shown in FIG. 12 is used which provides a concave/convex pattern on a Ni stamper. The mold includes a front cavity (also referred to as a cover mold or cavity side part) 214 and a rear cavity (also referred to as a movable half) 215, and a Ni stamper 228 is held by a stamper presser frame 225 on the rear cavity 215. The stamper presser frame 225 is shaped like a framework and sealed by the front cavity 214 and clamping to form a plate-shaped cavity 205.

The supercritical fluid and organic materials dissolved in the supercritical fluid are introduced to a stamper release surface through the channel 216.

Figure 13A:
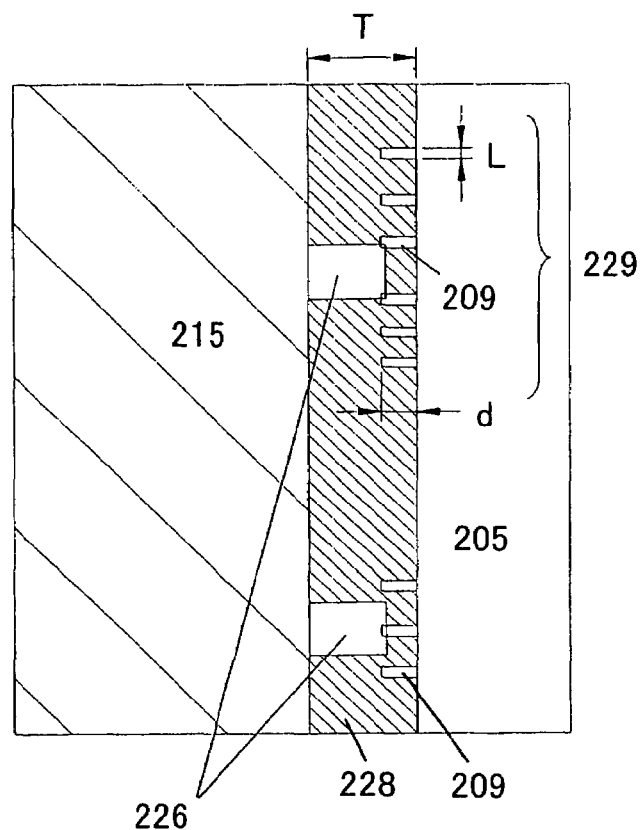
FIG. 13 is a partial enlarged view of an injection molding apparatus shown in FIG. 12.
Figure 13B:
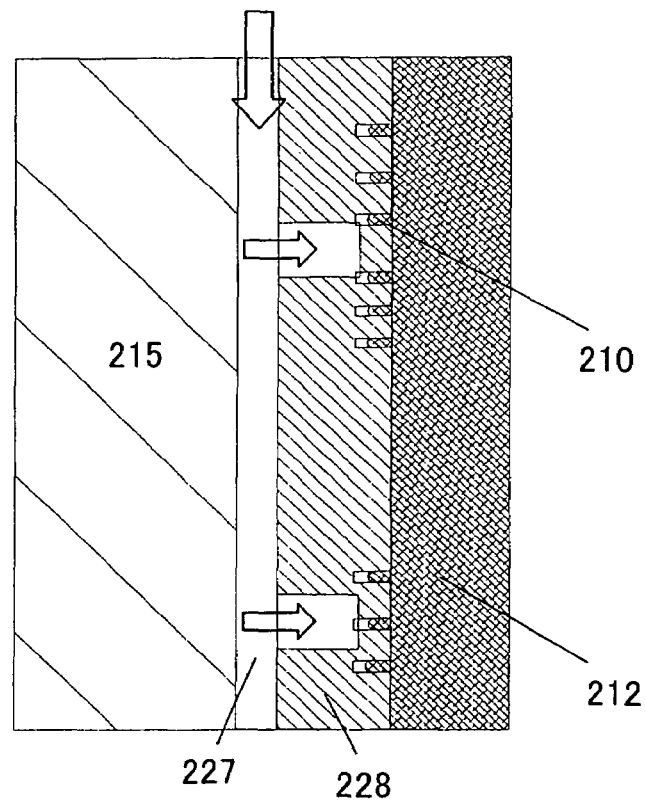

Referring now to FIGS. 13A and 13B that are enlarged views of part D in FIG. 12, a description will be given of a stamper shape and molding method of this embodiment.

The instant embodiment manufactured the stamper 228 as follows: Initially, photolithography patterns the resist provided on the silicone substrate, and manufactures a silicone die with a concave/convex shape of a high aspect ratio through dry etching using the resist as a mask. A method similar to a stamper manufacture process for optical discs makes the Ni stamper 228 with a thickness T of 0.3 mm through electrocasting. The stamper 228 sets a pattern width L of 0.05 mm and depth d of 0.1 mm in the groove part 209. A hole 226 with a diameter of 0.1 mm and depth of 0.2 mm is provided in place using mechanical processing from the rear surface of the stamper 228. The hole 226 is provided each groove 209 at isolated positions. For example, the group 229 in each groove part is connected to the same hole 226. The hole 226 may be made finer and deeper by laser processing for finer patterns. The depth of the hole 226 is the same and even for the pattern width L in the submicron order, and its diameter may be formed to be $\Phi 10$ µm or less.

In molding, similar to Example 4, supercritical fluid that dissolves metal complex is injected into the mold through the channel 216 after the injection. As shown in FIG. 13B, the supercritical fluid pushes up the elastic stamper 228 and the molten resin 212, forms a small clearance 227 on the rear surface of the stamper, and impregnates into the resin convex part 210 through the hole 226. Alternatively, a fine slit may be formed on the rear surface of the stamper, and serve as a channel for the supercritical fluid. Then, similar to Example 1, the stamper 228 and the rear cavity 215 may be adhered to each other again and the transfer and injection of the metallic complex at the convex part 210 finish by decreasing the pressure of the supercritical fluid and increasing the dwell of the resin.

According to the molding method of the instant embodiment, the wiring circuit becomes easily variable by forming a pattern for forming wires on a stamper. A thin stamper would enable the curved surface part of the mold to hold the stamper, facilitating a formation of a three-dimensional circuit. The fine processing technology, such as photolithography, is usable to make a pattern on the stamper to form the fine pattern in the submicron order.

Figure 14:
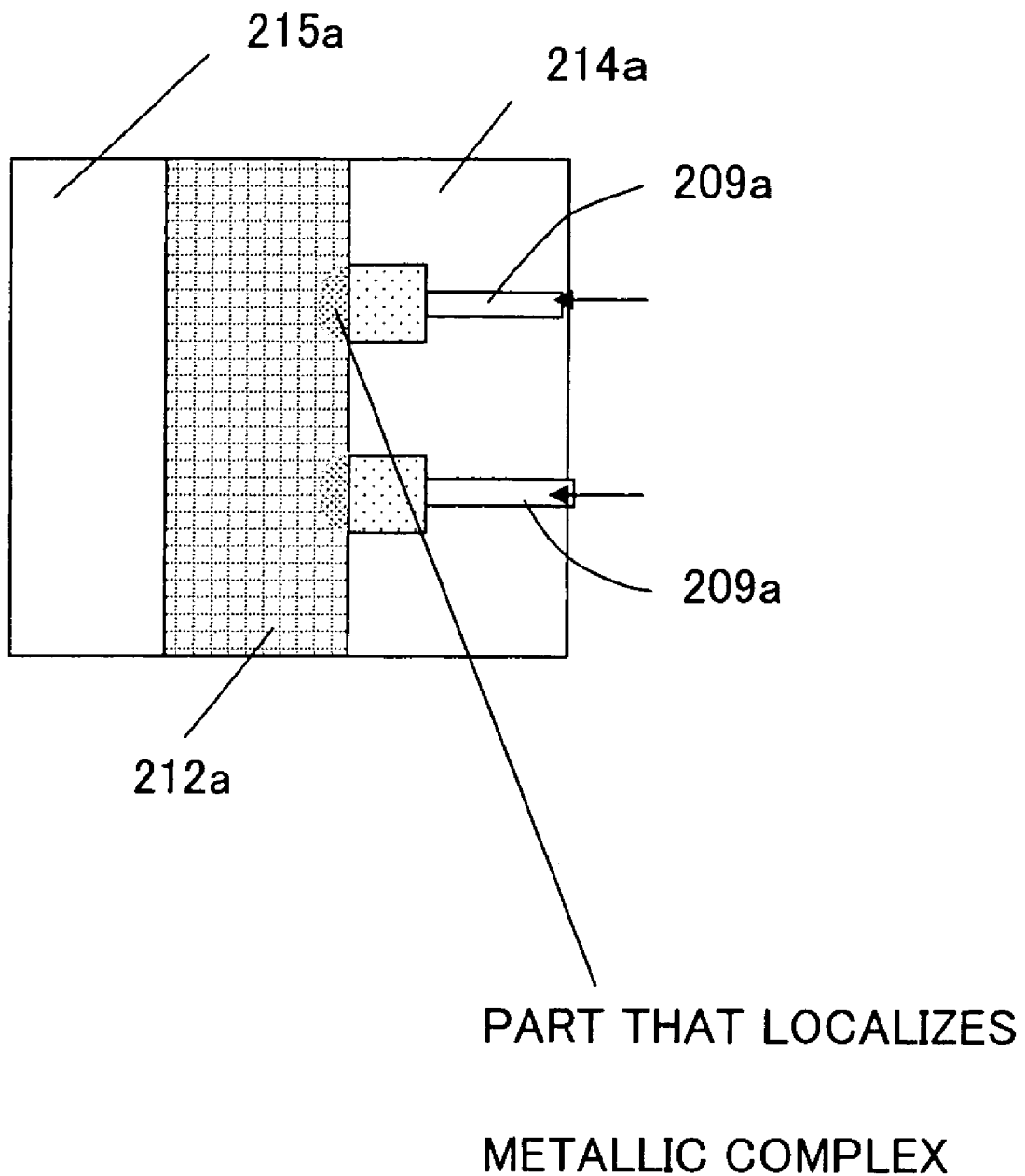
FIG. 14 is a partial sectional view of a mold as a variation of an embodiment shown in FIG. 11.
Figure 15:
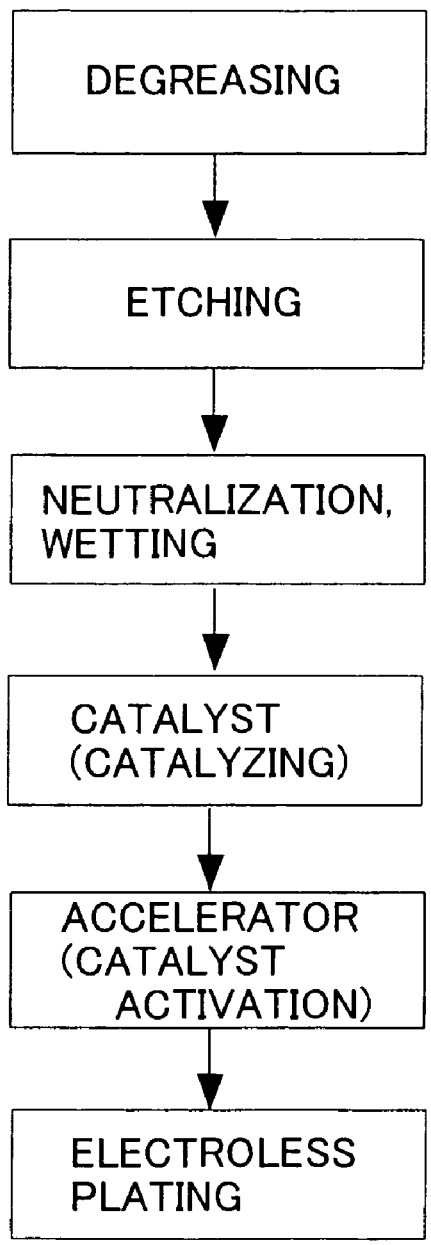
FIG. 15 is a flowchart of a conventional electroless plating method.
Figure 16:
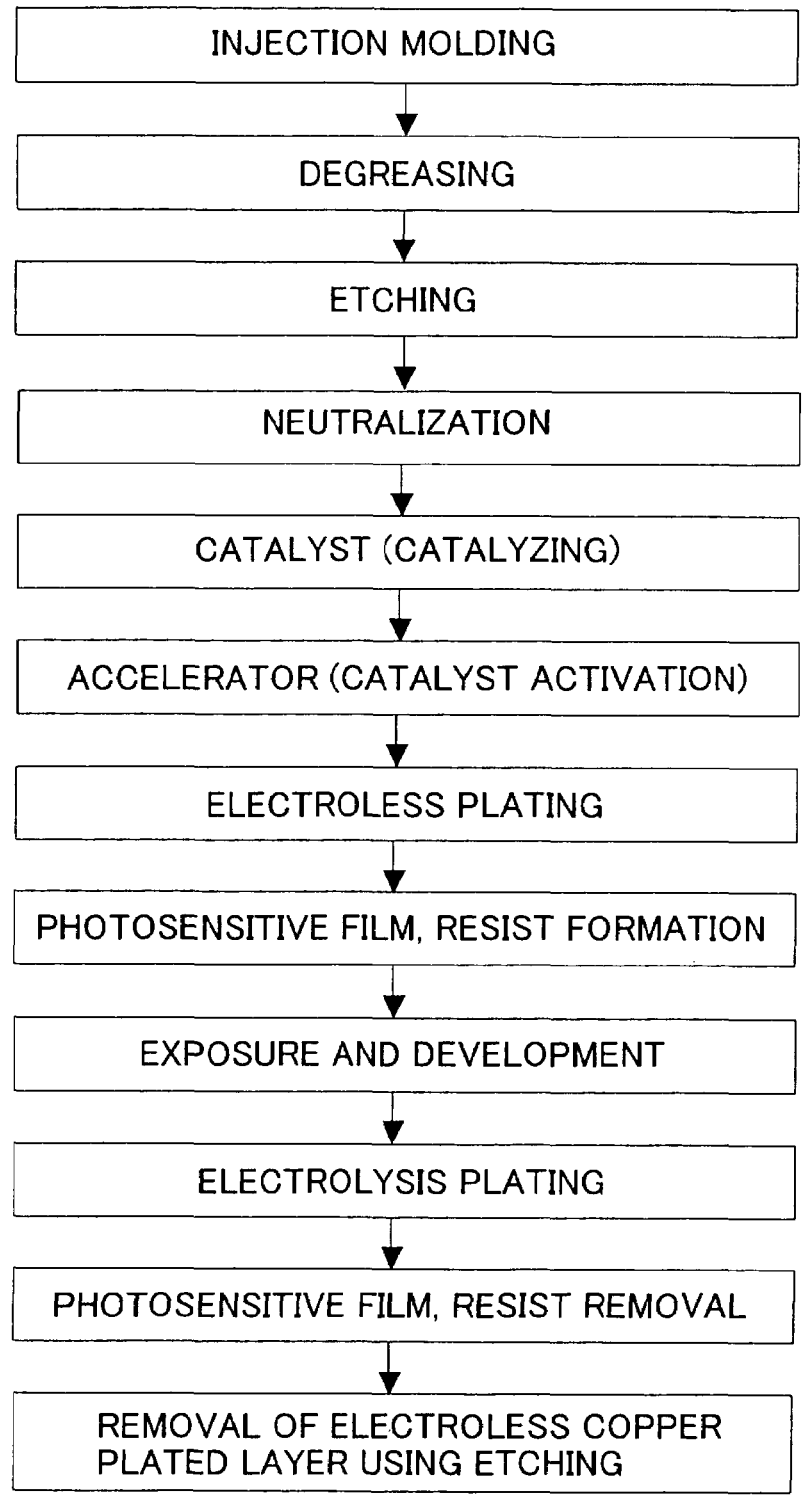
FIG. 16 is a flowchart for explaining a conventional plating wiring method.

Further, the present invention is not limited to these preferred embodiments, and various variations and modifications may be made without departing from the scope of the present invention. For example, while FIG. 11 fills the groove part 209 with the resin, and forms convex part on the resultant molded article, modifying the surface of the convex part, it is possible to locally modify the surface of the modified article that does not a convex or concave on its surface, as shown in FIG. 14. Here, FIG. 14 is a variation of the embodiment shown in FIG. 11. In FIG. 14, a mold that includes a front cavity 214a and a rear cavity 215a localizes groove parts 209a at specific positions on the flat molten resin (or molded article) 212a. The molded article may localize metal complex on and near its surface by introducing supercritical fluid that dissolves metal complex as shown by arrows of the groove part 209a, and adjusting (e.g., decreasing) pressure and/or temperature for injection molding.

Thus, one aspect of the present invention may modify a plastic surface at the time of injection molding without roughing a surface of the molded article or mold. For example, the injection molding simultaneously may improve the adhesion property of the plastic surface to the electroless plating. In addition, fine wiring may be inexpensively formed on the plastic surface using the electroless plating. According to another aspect of the present invention may provide a molded article whose surface is locally modified at the time of injection molding without roughing the surface, and a method and apparatus for manufacturing the same.

What is claimed is:

1. A method for manufacturing a molded article through injection molding of thermoplastic resin, said method comprising the steps of:
   injecting the thermoplastic resin into a mold; and
   adding a supercritical fluid containing a dissolved organometallic complex material to the mold; and
   separating the dissolved organometallic complex material on and modifying a surface of the molded article.

2. The method according to claim 1, wherein said injecting step includes the steps of:
   filling the thermoplastic resin into the mold; and
   introducing the supercritical fluid and organometallic complex material into the mold at a specific position of the mold.

3. The method according to claim 2, further comprising the step of arranging the organometallic complex material in the thermoplastic resin at the specific position by adjusting pressure and/or temperature of the mold.

4. The method according to claim 2, wherein said injecting step uses a stamper to be compressed against the thermoplastic resin that has filled up the cavity, and the stamper has a first surface that includes a predetermined pattern and is to be compressed against the thermoplastic resin, and a second surface that is opposite to the first surface and has a perforation connected to the pattern on the first surface.

5. The method according to claim 1, further comprising:
   compressing the thermoplastic resin after said injecting step; and
   increasing a volume of a cavity in the mold and expanding the thermoplastic resin after said compressing step.

6. The method according to claim 1, wherein essentially only a surface of the thermoplastic resin is modified by the supereritical fluid and organometallic complex material.

7. A method for manufacturing a molded article through injection molding of thermoplastic resin, said method comprising the steps of:
   injecting the thermoplastic resin and a first supercritical fluid component containing a dissolved organometallic complex material into a mold wherein the supercritical fluid component containing the dissolved organometallic complex material is in a flow front of the thermoplastic resin in injection filling; and
   separating the dissolved organometallic complex material on and modifying a surface of the molded article.

8. The method according to claim 7, wherein said injecting step includes the step of introducing, to the mold, the supercritical fluid and the organometallic complex material as counterpressure that applies pressure in a direction opposite to a flow direction of the thermoplastic resin that has been injected.

9. The method according to claim 7, wherein said injecting step includes the step of introducing, to the mold, the supercritical fluid and the organometallic complex material in a flow front of the thermoplastic resin in plasticization metering for plasticizing and metering a predetermined amount of thermoplastic resin for a next shot.

10. The method according to claim 7, wherein said injecting step includes the steps of:
    introducing a second supercritical fluid component without the organometallic complex material into part of the thermoplastic resin except for a flow front of the thermoplastic resin; and
    forming cellular porous media inside the thermoplastic resin that has been injected into the mold using the supercritical fluid.

11. The method according to claim 7, wherein said injecting step includes the steps of:
   filling the thermoplastic resin into the mold; and
   introducing the supercritical fluid and organometallic complex material into the mold at a specific position of the mold.

12. The method according to claim 11, further comprising the step of arranging the organometallic complex material in the thermoplastic resin at the specific position by adjusting pressure and/or temperature of the mold.

13. The method according to claim 11, wherein said injecting step uses a stamper to be compressed against the thermoplastic resin that has filled up the cavity, and the stamper has a first surface that includes a predetermined pattern and is to be compressed against the thennoplastic resin, and a second surface that is opposite to the first surface and has a perforation connected to the pattern on the first surface.

14. The method according to claim 7, wherein essentially only a surface of the thermoplastic resin is modified by the supereritical fluid and organometallic complex material.

* * * * *